United States Patent
Peng

(10) Patent No.: US 7,535,731 B2
(45) Date of Patent: May 19, 2009

(54) RETENTION DEVICE

(75) Inventor: Ying-Chao Peng, Taipei (TW)

(73) Assignee: Inventec Corporation, Taipei (TW)

( * ) Notice: Subject to any disclaimer, the term of this patent is extended or adjusted under 35 U.S.C. 154(b) by 112 days.

(21) Appl. No.: 11/858,993

(22) Filed: Sep. 21, 2007

(65) Prior Publication Data

US 2009/0080171 A1 Mar. 26, 2009

(51) Int. Cl.
*H05K 7/02* (2006.01)
*H05K 7/04* (2006.01)

(52) U.S. Cl. ............... 361/807; 361/810; 361/801; 361/802

(58) Field of Classification Search ............ 361/807, 361/810, 801–802, 600, 679, 752, 790, 797, 361/800; 174/138 G, 138 E
See application file for complete search history.

(56) References Cited

U.S. PATENT DOCUMENTS

| | | | | |
|---|---|---|---|---|
| 6,741,460 B2 * | 5/2004 | Huang | ............... | 361/683 |
| 6,798,669 B1 * | 9/2004 | Hsu | ............... | 361/801 |
| 6,917,518 B2 * | 7/2005 | Chen | ............... | 361/683 |
| 6,982,878 B2 * | 1/2006 | Chen et al. | ............... | 361/801 |
| 7,151,677 B2 * | 12/2006 | Le et al. | ............... | 361/807 |
| 7,430,129 B1 * | 9/2008 | Peng | ............... | 361/807 |

* cited by examiner

*Primary Examiner*—Hung S Bui
(74) *Attorney, Agent, or Firm*—Workman Nydegger

(57) ABSTRACT

A retention device is applied in an electronic device that has a case and a circuit board. The circuit board may shift relative to the case along a integrate direction or a release direction. The retention device includes a fixed base, a fastener, and a latching member. The fixed base is disposed on the case and has a slot. The fastener is disposed on the case, and may be deformed under a force. The latching member is disposed on one side of the circuit board. When the latching member shifts along the integrate direction with the circuit board, the fastener is pressed to be deformed, so the latching member is limited in the slot. When the fastener is deformed by an external force, the latching member is disengaged with the slot along the release direction, so that the circuit board may be fixed on or detached from the case.

8 Claims, 8 Drawing Sheets

RETENTION DEVICE

BACKGROUND OF THE INVENTION

1. Field of Invention

The present invention relates to a retention device, and more particularly to a retention device for locking and fixing a circuit board without bolts.

2. Related Art

Currently, with the rapid development of science, technology and information, a computer device has become a quite popular electronic device. In the current market, computer devices, such as desktop computers, notebook computers, or servers, are all provided with a mainboard therein as a kernel member of a compute system, so that computer peripheral hardware, such as a central processing unit (CPU), a memory module, and a PCI card, electrically connected to the mainboard may perform default functions successfully.

The mainboard is usually fixed as follows. A plurality of conductive bosses is formed on a case of a computer device as fixing means, and a plurality of through holes corresponding to the conductive bosses is formed in the mainboard. The mainboard is laid on the conductive bosses to keep a suitable distance from the case, and then, a plurality of bolts penetrate the through holes of the mainboard, and are locked on the conductive bosses, with a result that the mainboard is suspended by the aid of the conductive bosses, and leg contacts on the back side of the mainboard are prevented from directly contacting the case to cause a short circuit.

With regard to the conventional method of locking and fixing the mainboard by the conductive bosses, when the mainboard is being mounted and dismounted, a user has to lock and release the bolts one by one with the same actions, which is quite complicated and time-consuming and also inconvenient in practical use. Furthermore, the present electronic device is required to be light, thin, short, and small, but too many conductive bosses will occupy more area of the mainboard. The circuit layout on the mainboard cannot be achieved easily, and the volume of the whole electronic device cannot be microminiaturized, either.

In recent years, a thumb screw emerges is developed, which may be screwed directly by hand, so as to serve as a positioning means for fixing the mainboard. As shown in FIG. 1, it is a schematic view of fixing a circuit board 20 on a case 10 using a thumb screw 60 under a normal circumstance. The case 10 has a plurality of positioning posts 11 with a screw hole 61, in which a neck 12 is formed around the middle portion of each positioning post 11. The circuit board 20 has a plurality of positioning holes 21 corresponding to the positioning posts 11. Each of the positioning holes 21 shapes like a calabash and has a wide section 22 and a narrow section 23, and the front end of the positioning post 11 penetrates the wide section 22 of the positioning hole 21. In this manner, the circuit board 20 may slide on the case 10 by the positioning posts 11, so that the narrow section 23 of each of the positioning hole 21 is engaged into each of the neck 12 of the positioning posts 11. Subsequently, the circuit board 20 may be fixed on the case 10 merely by making the thumb screw 60 penetrate the circuit board 20 and screw it into the screw hole 61.

The method of locking the circuit board on the mainboard by using the thumb screw may significantly reduce the quantity of the conductive bosses, and solve the problems caused by the method of locking the mainboard by the conductive bosses. However, the method of locking the mainboard by the thumb screw is still a locking method by screwing, and through this method, the process of mounting and dismounting the mainboard is too complicated and time consuming. Furthermore, the cost of the thumb screw is also higher than that of the conventional bolt, thereby causing a high manufacturing cost.

For person skilled in the art, it is an urgently problem that how to truly fix the mounting position of the mainboard in a screwless manner, and enable users to mount and dismount the mainboard rapidly and conveniently.

SUMMARY OF THE INVENTION

In view of the aforementioned problems, the object of the present invention is to provide a retention device, so as to solve the problems existing in the conventional mainboard is mounted and dismounted by a screwing manner, the volume of an electronic device cannot be microminiaturized, and the mounting and dismounting period is too complicated and time-consuming and achieves the locking purpose by using a tool, thereby causing a high manufacturing cost and inconvenience in operation.

The retention device disclosed in the present invention is applied in an electronic device. The electronic device has a case and a circuit board. The circuit board may shift relative to the case along a integrate direction or a release direction, so as to be caught by the case or detached from the case, and the circuit board is fixed on the case by the retention device.

The retention device includes a fixed base, a fastener, and a latching member. The fixed base is disposed on the case, and has a slot formed therein, the slot has an opening at one end thereof. The fastener has a combining portion and an elastic portion, the combining portion is disposed on the case, and the elastic portion blocks off the opening of the slot and may be deformed under a force. The latching member is mounted on one side of the circuit board opposite to the fastener. When the latching member shifts along the integrate direction with the circuit board, the elastic portion is pressed to be deformed, so the latching member shifts to be accommodated in the slot through the opening. Through the recovery and deformation of the elastic portion, the latching member is blocked off by the elastic portion to be limited in the slot, so that the circuit board is fixed on the case. When the elastic portion is deformed under an external force, the latching member is disengaged with the slot along the release direction through the opening, so that the circuit board is detached form the case.

The efficacies of the present invention lie in that, the circuit board of the electronic device may be mounted on the case firmly by the blocking of the retention device according to the present invention, users may mount or dismount the circuit board more easily and rapidly without screwing or unscrewing a plurality of screws, and may fix the position of the circuit board in a screwless manner.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

The retention device of the present invention is applied in a electronic device which likes a computer device provided with a circuit board to execute actions, such as desktop computers, notebook computers, and severs. In the following detailed description of the present invention, the notebook is used as a preferred embodiment of the present invention, and the accompanying drawings are merely provided for reference and illustration and are not intended to limit the present invention.

Figure 1:
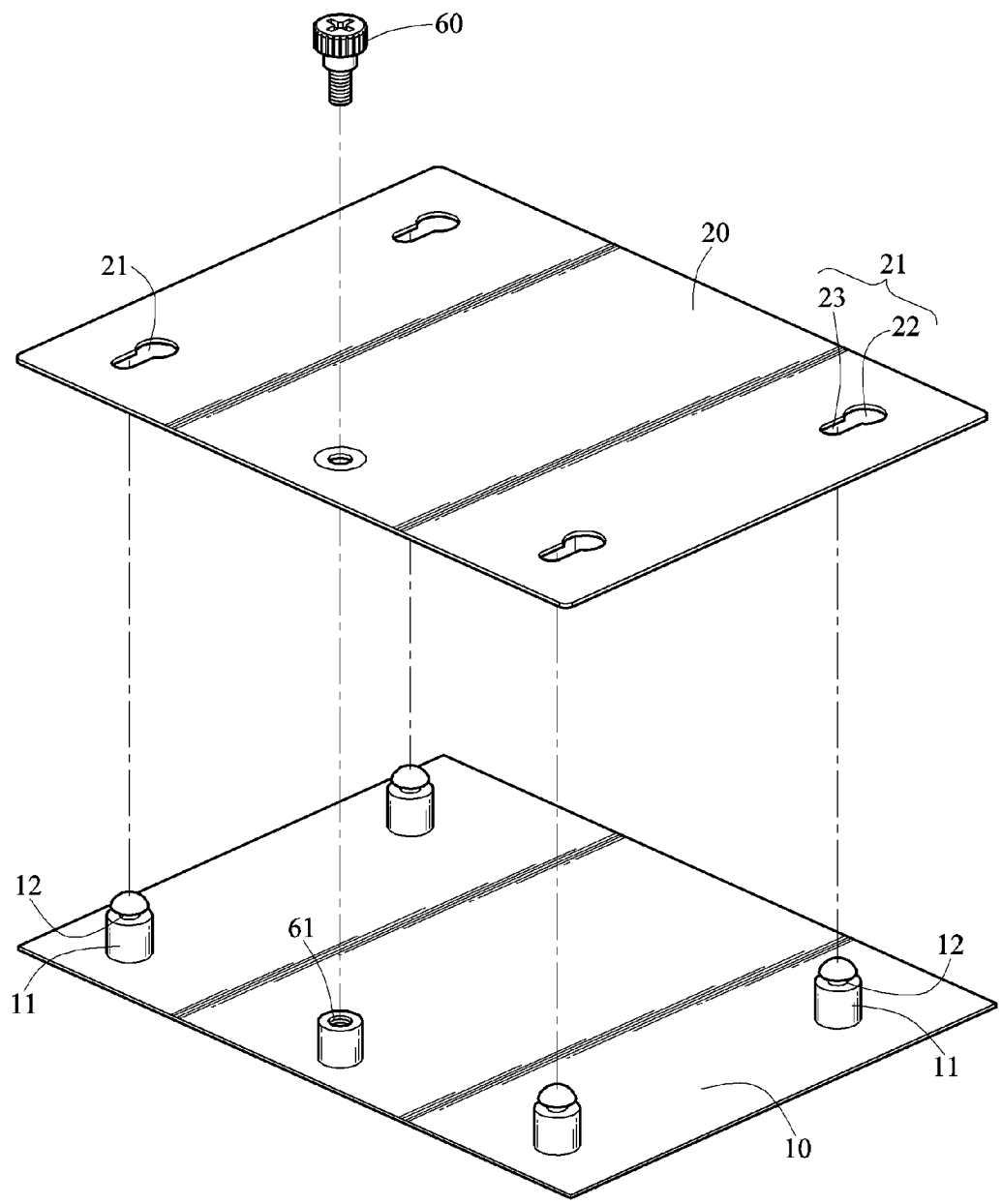
FIG. 1 is an exploded view of the conventional art.
Figure 2:
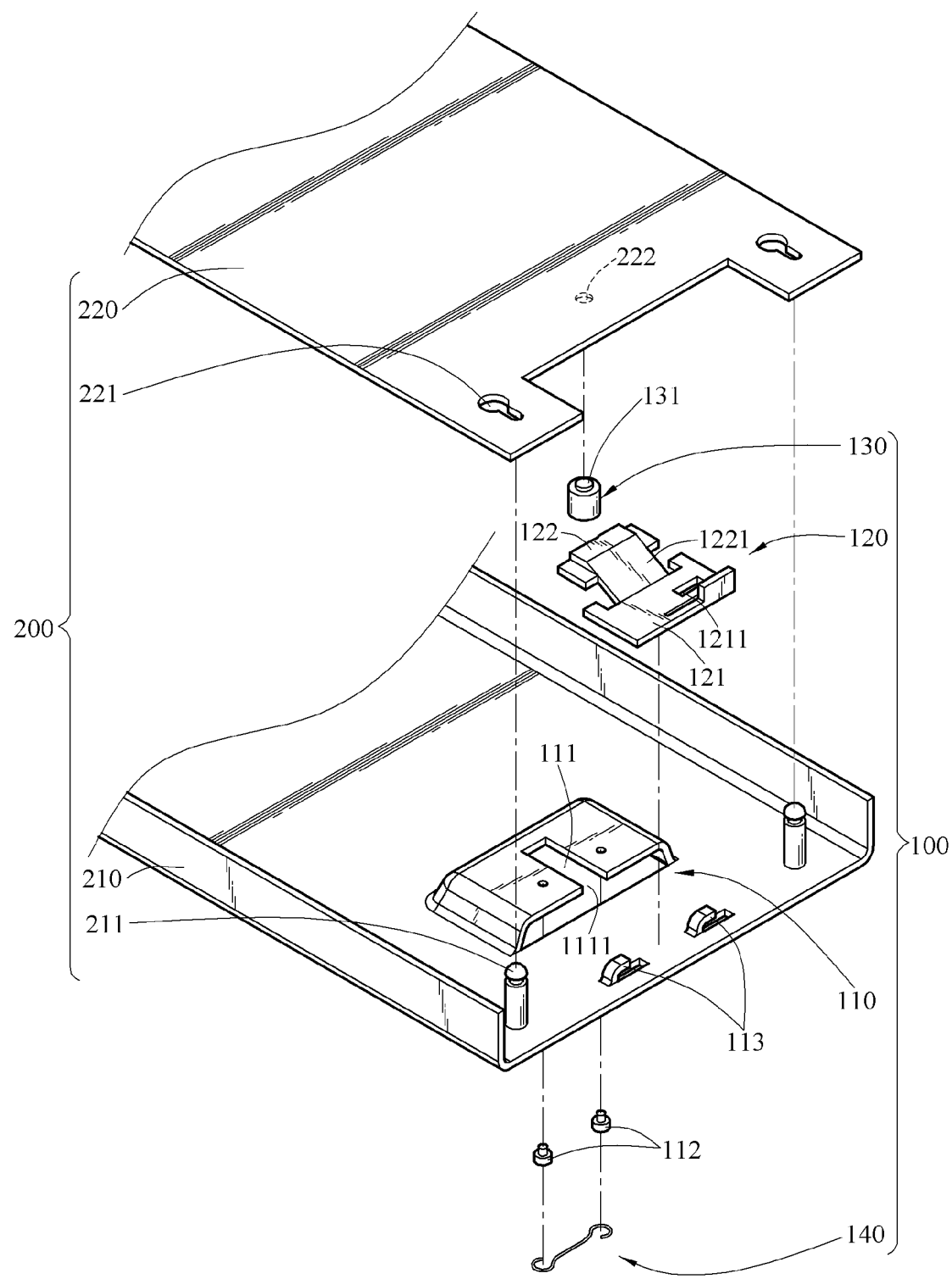
FIG. 2 is an exploded view of the present invention.

FIG. 2 is an exploded view of the present invention. The retention device 100 disclosed in the present invention is applied in an electronic device 200. The electronic device 200 includes a case 210 and a circuit board 220, the case 210 has at least one combination post 211 thereon, and the circuit board has at least one combination hole 221 formed therein. The combination post 211 is a post with a top size slightly larger than the body size, and the combination hole 221 is a calabash-shaped structure formed of a large hole and a small hole extending from the circumference of the large hole, so as to accommodate the top of the combination post 211. The circuit board 220 may shift relative to the case 210 along the integrate direction or the release direction, so that the combination post 211 and the combination hole 221 are engaged with each other, and the circuit board 220 may be caught by or detached from the case 210.

Referring to FIG. 2, the retention device 100 of the present invention includes a fixed base 110, a fastener 120, and a latching member 130. The fixed base 110 is disposed on the case 210, and the fixed base 110 has a long and narrow slot 111, and the slot 111 has an opening 1111 at one end thereof. In addition, a fixing post 112 is disposed adjacent to two sides of the accommodation slot 111 respectively, and two hooks 113 are formed on and protrude from the fixed base 110.

The fastener 120 has a combining portion 121, and an elastic portion 122 extending from the combining portion 121. The combining portion 121 has a hole 1211, which is engaged with one hook 113 of the fixed base 110, and another hook 113 is hooked on the combining portion 121, so that the combining portion 121 may be mounted on the case 210 firmly. The elastic portion 122 is adjacent to the slot 111 and blocks off the position of the opening 1111 of the slot 111. The elastic portion 122 further has a guiding bevel 1221 and may be elastically deformed under a force.

One end of the latching member 130 has a bump 131, and one side of the circuit board 220 that opposite to the fastener 120 has a combination portion 222. The bump 131 and the combination portion 222 are engaged with each other, so that the latching member 130 is fixed on one side of the circuit board 220 opposite to the fastener 120.

As shown in FIG. 2, the retention device 100 of the present invention further includes an elastic member 140. A buckling portion 141 is formed on two ends of the elastic member 140 respectively, and buckled with the fixing posts 112 respectively disposed on both sides of the slot 111, so that the elastic member 140 is disposed across the slot 111, and exerts an elastic force on the latching member 130 along the release direction in a normal state.

Figure 3A:
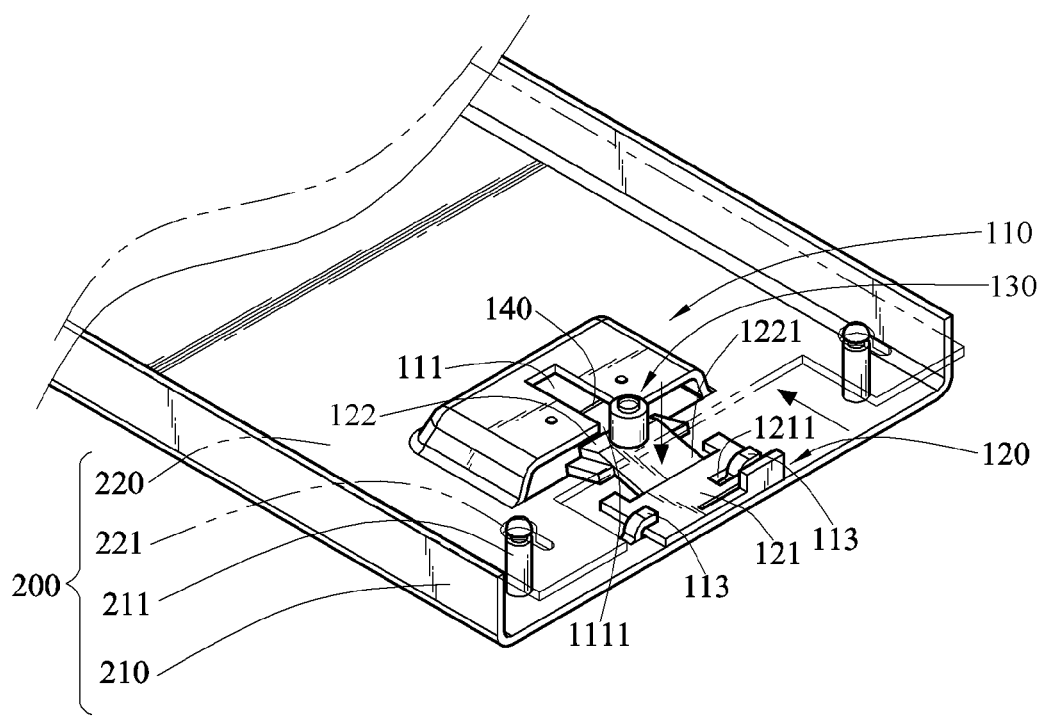
FIG. 3A is a perspective view of the present invention in the mounting state.
Figure 3B:
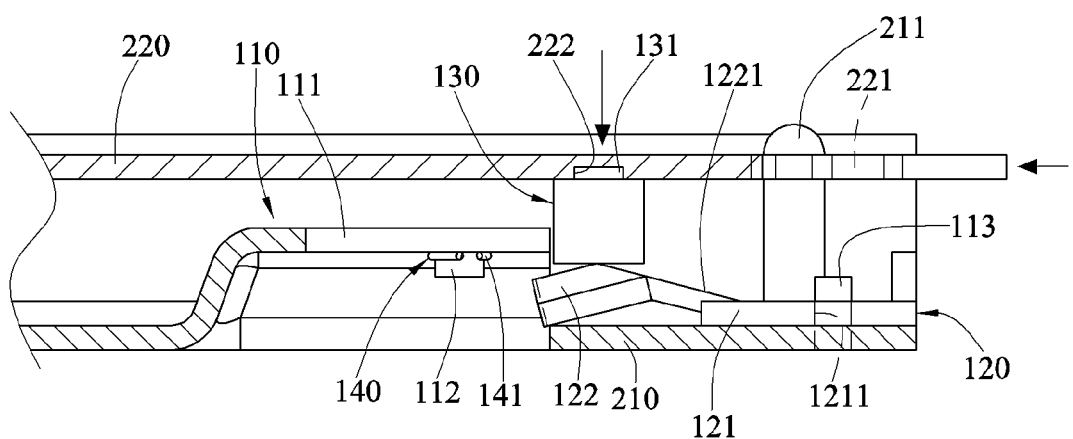
FIG. 3B is a sectional side view of the present invention in the mounting state.

FIGS. 3A and 3B are a perspective view and a sectional side view of the circuit board in the mounting state, respectively. When the latching member 130 shifts along the integrate direction with the circuit board 220, the guiding bevel 1221 will guide the latching member 130 to press downward the elastic portion 122 to make it deformed.

Figure 4A:
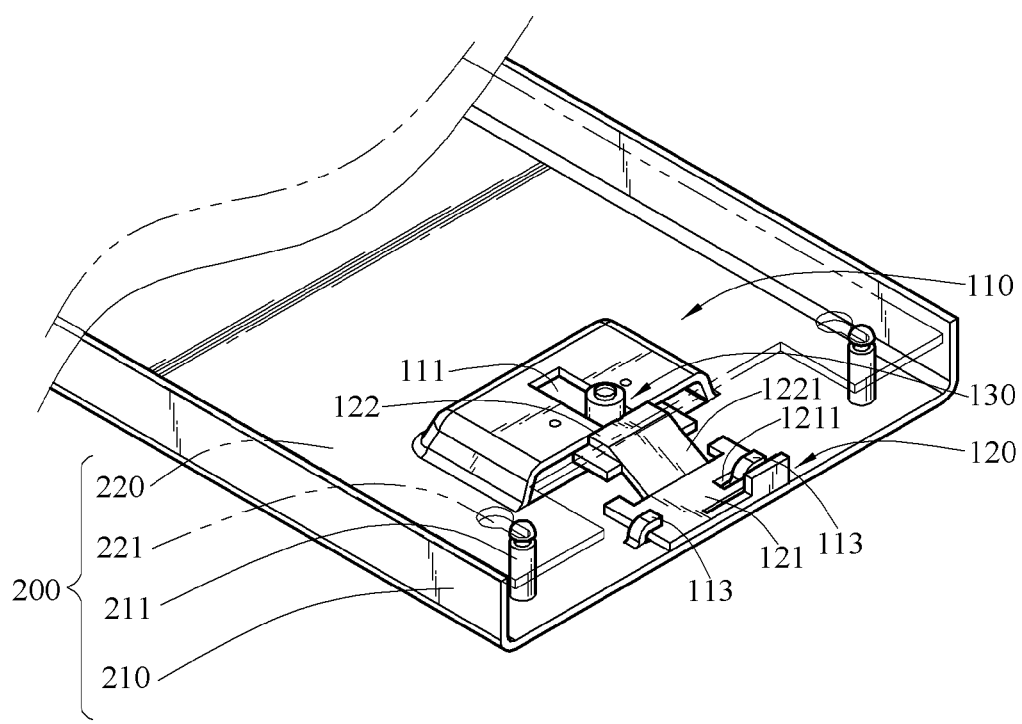
FIG. 4A is a perspective view of the present invention in the combined state.
Figure 4B:
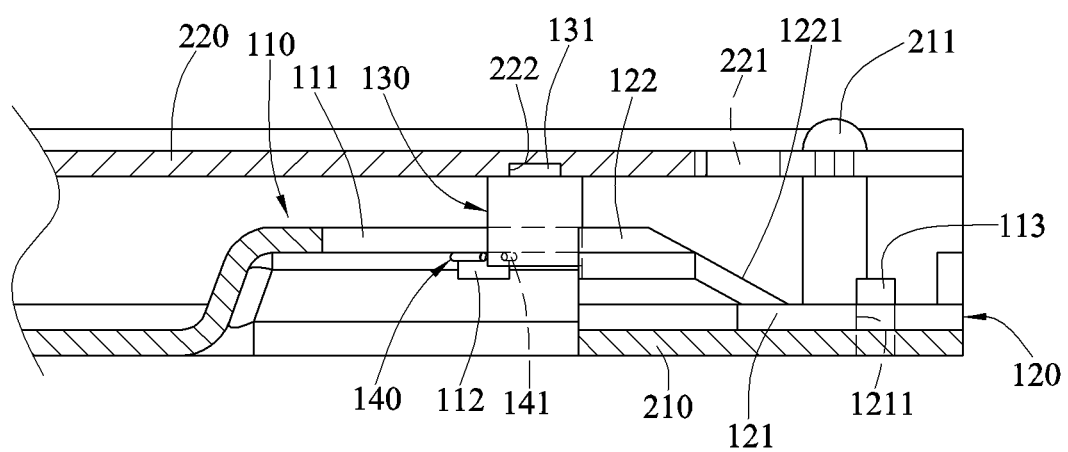
FIG. 4B is a sectional side view of the present invention in the combined state.

As shown in FIGS. 4A and 4B which are the schematic views of the circuit board in a combining state, the latching member 130 continuously shifts along the integrate direction, and guided by the guiding bevel 1221 to be accommodated in the slot 111 through the opening 1111, so that the combination hole 221 and the combination post 211 are engaged with each other. When the latching member 130 is accommodated in the slot 111, the elastic portion 122 pressed downward under a force is elastically recovered to the initial state in response to the release of the force, and blocks off the opening 1111 of the slot 111. The latching member 130 is limited in the slot 111 by the blocking of the elastic portion 122 recovered to the initial state and the elastic member 140, so that the circuit board 220 is fixed on the case 210.

Figure 5A:
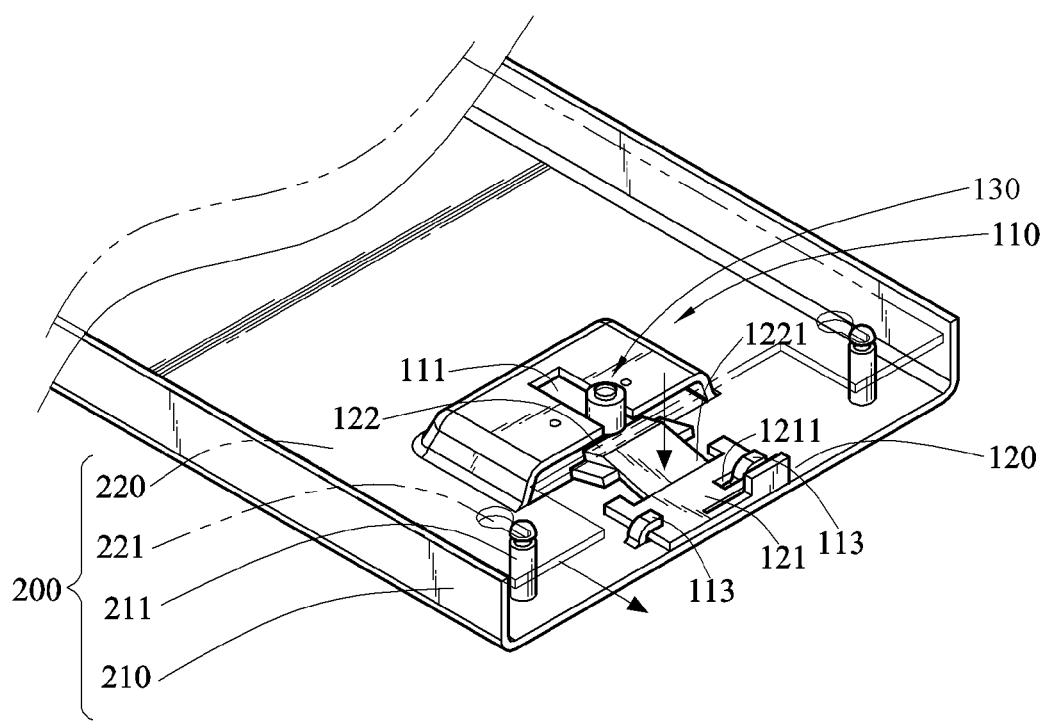
FIG. 5A is a perspective view of the present invention in the release state.
Figure 5B:
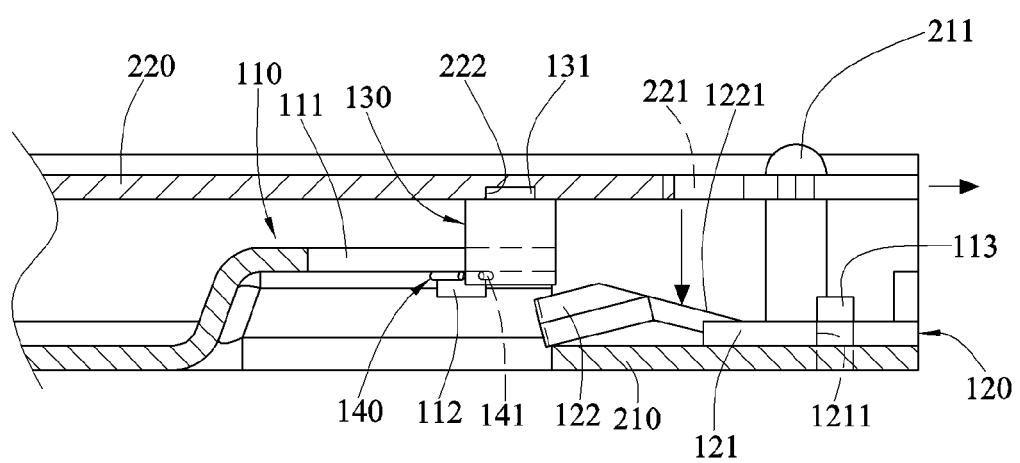
FIG. 5B is a sectional side view of the present invention in the release state.

Referring to FIGS. 5A and 5B, the schematic views of the circuit board in the release state are shown. In order to detach the circuit board 220 from the case 210, the elastic portion 122 is pressed downward to be deformed under an external force, the latching member 130 is pushed by the elastic member 140 to shift along the release direction and disengaged with the slot 111 through the opening 1111, and meanwhile, the combination post 211 drops off from the combination hole 221, so that the circuit board 220 is detached from the case 210.

The retention device of the present invention is used to provide a blocking and fixing function, so as to make the circuit board be mounted on the case firmly without a plurality of sets of bolts for fixing the circuit board, thereby truly achieving the purpose of fixing the circuit board in a screwless manner, enabling users to assemble and disassemble the circuit rapidly and easily, and greatly enhancing the convenience in operation.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A retention device, applied in an electronic device comprising a case and a circuit board, wherein the circuit board shifts relative to the case along a integrate direction or a release direction, so as to be caught by the case or detached from the case, and the circuit board is fixed on the case through the retention device, the retention device comprising:

a fixed base, disposed on the case and having a slot;

a fastener, having a combining portion and an elastic portion, wherein the combining portion is disposed on the case, and the elastic portion blocks off an opening of the slot and is deformed under a force; and a latching member, disposed on a side of the circuit board opposite to the fastener, the latching member shifting along the integrate direction with the circuit board, pressing the elastic portion to make it deformed, and shifting to be accommodated in the slot through the opening and blocked by the elastic portion, so as to fix the circuit board.

2. The retention device as claimed in claim 1, wherein the latching member is disengaged with the slot through the opening along the release direction when the elastic portion is deformed under an external force, so as to detach the circuit board from the case.

3. The retention device as claimed in claim 1, wherein the elastic portion further comprises a guiding bevel for guiding the latching member to slide and press the elastic portion to make it deformed, so that the latching member enters the slot through the opening.

4. The retention device as claimed in claim 1, further comprising an elastic member which is disposed across the slot, so as to exert an elastic force on the latching member in the release direction in a normal state.

5. The retention device as claimed in claim 4, wherein two ends of the elastic member has a buckling portion respectively, a fixing post is disposed adjacent to two sides of the slot respectively, and the buckling portions are engaged with the fixing posts, so that the elastic member is fixed across the slot.

6. The retention device as claimed in claim 1, wherein the case is further provided with at least one hook, the combining portion has at least one hole, and the hook is locked with the hole, so that the fastener is fixed on the fixed base.

7. The retention device as claimed in claim 1, wherein the latching member further has a bump, one side of the circuit board has a combination portion corresponding to the bump, and the bump is engaged in the combination portion, so that the latching member is fixed on the circuit board.

8. The retention device as claimed in claim 1, wherein the circuit board further has at least one combination hole, the case has at least one combination post, and the combination hole is combined to the combination post, so that the circuit board is caught by the case.

* * * * *